US012661754B2

(12) United States Patent
Chung et al.

(10) Patent No.: US 12,661,754 B2
(45) Date of Patent: *Jun. 23, 2026

(54) ZONE-BASED CMP TARGET CONTROL

(71) Applicant: Taiwan Semiconductor Manufacturing Co., Ltd., Hsinchu (TW)

(72) Inventors: Che-Liang Chung, Hsinchu (TW); Che-Hao Tu, Hsinchu (TW); Kei-Wei Chen, Hsinchu (TW); Chih-Wen Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 153 days.

This patent is subject to a terminal disclaimer.

(21) Appl. No.: 18/601,670

(22) Filed: Mar. 11, 2024

(65) Prior Publication Data

US 2024/0217052 A1 Jul. 4, 2024

Related U.S. Application Data

(63) Continuation of application No. 16/538,464, filed on Aug. 12, 2019, now Pat. No. 11,951,587.

(60) Provisional application No. 62/736,958, filed on Sep. 26, 2018.

(51) Int. Cl.
B24B 37/005 (2012.01)
B24B 51/00 (2006.01)
H10P 72/00 (2026.01)

(52) U.S. Cl.
CPC ............ B24B 37/005 (2013.01); B24B 51/00 (2013.01); H10P 72/0604 (2026.01)

(58) Field of Classification Search
CPC ..... B24B 37/005; B24B 37/013; B24B 37/07; B24B 37/10; B24B 49/02; B24B 49/04; B24B 49/12
See application file for complete search history.

(56) References Cited

U.S. PATENT DOCUMENTS

| | | | |
|---|---|---|---|
| 6,045,435 A | 4/2000 | Bajaj et al. |
| 7,544,617 B1 | 6/2009 | Chandra et al. |
| 2005/0106872 A1 | 5/2005 | Hong et al. |
| 2007/0123046 A1 | 5/2007 | Ravid et al. |
| 2009/0047881 A1 | 2/2009 | Satitpunwaycha et al. |
| 2010/0029177 A1 | 2/2010 | Kobayashi et al. |
| 2012/0129431 A1 | 5/2012 | Hui et al. |
| 2017/0256414 A1 | 9/2017 | Liu et al. |

FOREIGN PATENT DOCUMENTS

| | | |
|---|---|---|
| CN | 101005025 A | 7/2007 |
| CN | 101124662 A | 2/2008 |
| CN | 102280367 A | 12/2011 |
| CN | 108025419 A | 5/2018 |

(Continued)

*Primary Examiner* — Joel D Crandall
(74) *Attorney, Agent, or Firm* — Seed IP Law Group

(57) ABSTRACT

The present disclosure is directed to techniques of zone-based target control in chemical mechanical polishing of wafers. Multiple zones are identified on a surface of a wafer. The CMP target is achieved on each zone in a sequence of CMP processes. Each CMP process in the sequence achieves the CMP target for only one zone, using a CMP process selective to other zones.

20 Claims, 7 Drawing Sheets

(56)              References Cited

FOREIGN PATENT DOCUMENTS

| | | | |
|---|---|---|---|
| JP | 2001257188 | A | 9/2001 |
| JP | 2002077605 | A | 3/2002 |
| JP | 2008168380 | A | 7/2008 |
| JP | 2009200235 | A | 9/2009 |
| JP | 2012221104 | A | 11/2012 |
| JP | 2017064801 | A | 4/2017 |
| KR | 10-2000-0062541 | A | 10/2000 |
| TW | 495901 | B | 7/2002 |
| WO | WO-2012148716 | A2 * | 11/2012 ............. G01N 21/41 |

* cited by examiner

100

110

120

122

118

116

114

112    112    112

Controller
150

ZONE-BASED CMP TARGET CONTROL

BACKGROUND

Chemical mechanical polishing (CMP) processes are widely used in the fabrication of integrated circuits (IC). As an IC is built up layer by layer on the surface of a semiconductor wafer, CMP processes are used to polish or planarize the top most layer or layers to provide a leveled surface for subsequent fabrication steps. A CMP process is carried out by placing a wafer in a carrier (also called polish head) that presses the to-be-polished wafer surface against a polish pad attached to a platen. Both the platen and the wafer carrier are rotated while a CMP slurry containing abrasive particles and reactive chemicals is applied to the polishing pad. The slurry is transported to the wafer surface via the rotation of the porous polish pad. The relative movement of the polish pad and the wafer surface coupled with the reactive chemicals in the slurry allows the CMP process to level the wafer surface by means of physical and chemical forces.

To improve the yield of CMP processes, within-wafer (WiW) uniformity needs to be accurately controlled. Further, with the device dimension continuously scaling down, final target control of a CMP process, i.e., the thickness of the leveled wafer surface, contributes as a key factor of device performance. As such, the wafer-to-wafer (WtW) uniformity also needs be accurately controlled.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
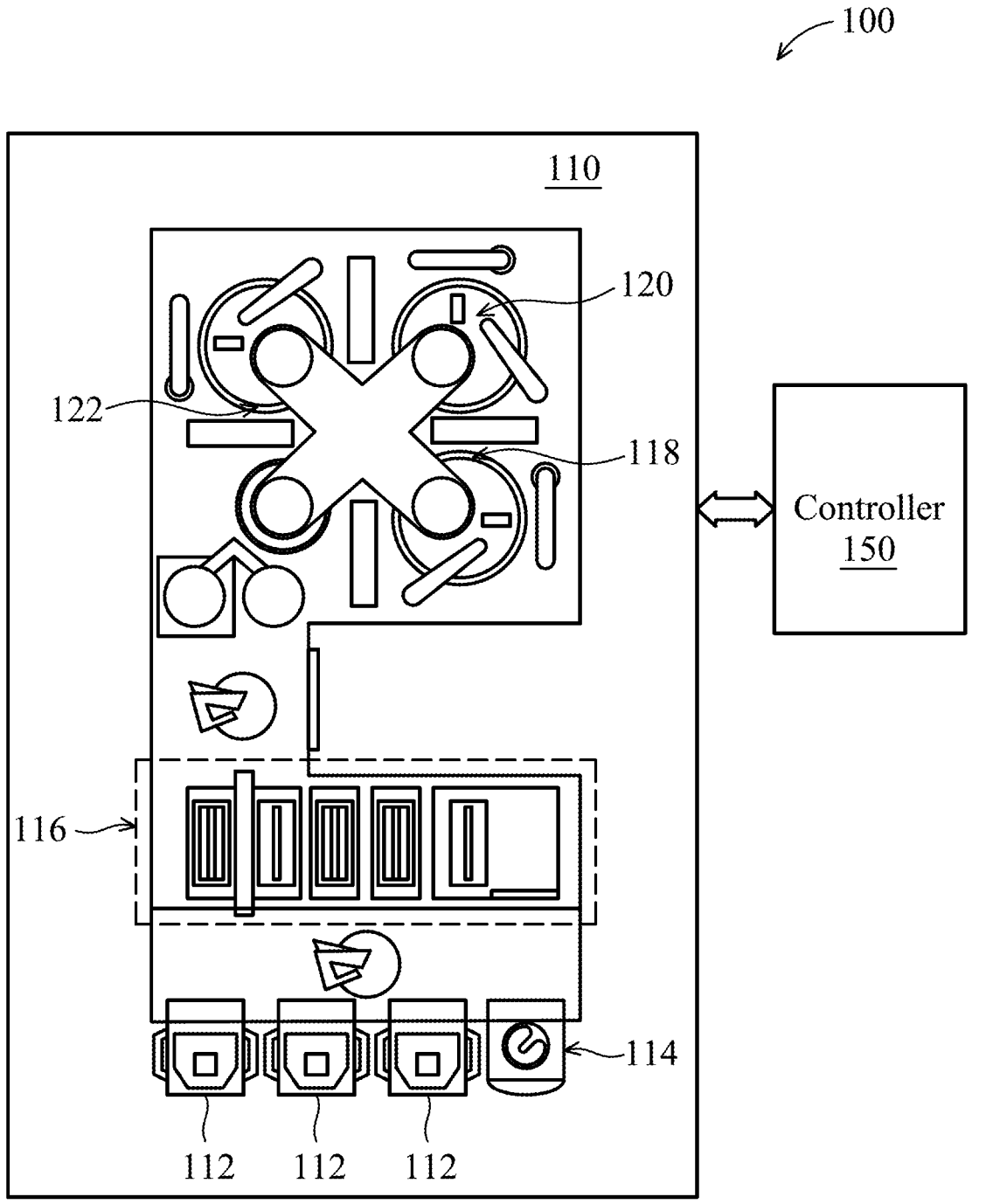
FIG. 1 illustrates an example CMP environment according to embodiments of the disclosure.

As critical dimensions of integrated circuits (IC) continuously shrink for each new technology node, more demanding requirements have been imposed on wafer planarity and depth of focus (DOF) limits. For example, with the gate-last high-K metal gate (HKMG) technology being adopted starting at the 45 nm technology node, the poly-open planarization (POP) and the replacement metal gate (RMG) planarization CMP process are introduced to the front end of line (FEOL) process flow. The POP and RMG CMP processes are critical because variations in the gate height lead to substantial transistor performance variations, e.g., the ON state current value variation. For example, in a RMG CMP process, the final target thickness (target) needs to be well controlled.

At the same while, more varieties of devices and functions are integrated into ICs, the different devices and functions involve different materials, structures, and feature densities on the wafer surface to be polished, which pose additional challenges for CMP target and uniformity controls. Further, complicated CMP target control schemes also come with higher cost as additional process steps are added and consumables are increased.

The present techniques identify multiple zones on a surface of a wafer. The multiple zones are identified based on the differences in the structure features within the relevant wafer surface areas. The structure features include, but are not limited to, the density or ratio of various metal features versus dielectric features, the relative sizes of the metal features and the dielectric features, the metal materials of the metal features, and/or whether or not a surface layer of a zone requires a further fabrication process before reaching the CMP target. The multiple zones may be identified with reference to structure features other than the listed examples. The structural features affect the polishing removal rate of the individual features in a CMP process and affect how the individual features change during the polishing process. Understanding the zone-specific CMP removal rates and effects is important because the erosion of dielectric features and/or the dishing of metal features all affect the wafer yield and the device performance.

For the WiW uniformity of a planarization operation, the multiple zones ultimately have a same or similar CMP target thickness, i.e., thickness of the wafer after the planarization operation. The current technique does not achieve the CMP target for all the zones through a single target control process. Instead, the technique includes a zone-based CMP target control with multiple stages of CMP processing, each stage of CMP processing achieving the CMP target for a zone or a group of zones, but not for the whole wafer. Each stage of the CMP process achieves a CMP target for a zone or a group of zones, referred to as "target zone" or "target zones," but not all the zones. At each stage, the CMP process, e.g., the turntable rotary speed, the surface pressure, the slurry, the pad, and other parameters/conditions of conducting the CMP, is customized to have a higher polish rate for the features in the target zone, i.e., to be more effective in polishing the features in the target zones, and is configured to be selective to other zones that have not reached the CMP target. For other zones that have already reached the CMP target before the current target zones, the selective recipe works to minimize the impact of the CMP process of the target zone on such other zones. As a consequence, after the CMP stage of polishing the target zone, other zones have thickness values either substantially equal to the target zone or higher than the target zone.

The CMP target does not need to be the final target for the CMP operation. A CMP operation may include multiple targets for difference purposes. For example, a CMP operation may include a high-rate polishing target for a high polishing rate process to achieve WiW uniformity, a low-rate polishing target to achieve WtW uniformity, and a buffing target to improve the surface quality of the wafer, e.g., to remove surface defects and scratches that resulted from the low rate polishing and/or the high-rate polishing. The zone-based target control may be applied in one or more of the multiple targets. In an embodiment, the zone-based target control is used in a high-rate polishing of a wafer and after the high-rate polishing, the zones on the wafer surface are polished together in one or more of the low-rate polishing and/or the buffing polishing using an un-zoned target control, e.g., the target thickness is achieved for the whole surface of the wafer.

In another embodiment, the multiple targets of the CMP operation are all controlled for each individual zone or individual group of zones separately in the stages of the CMP operation.

The zone-specific CMP processes include one or more of mechanical components and chemical components. The mechanical components include, but are not limited to, the properties of the polishing pad, the pressure distribution on the back of the wafer, the rotation speed, the down-force on the wafer surface, and/or other mechanical parameters of the CMP process. The chemical components include the CMP slurry composition that is efficient in polishing the target zone with selectivity to other zones, e.g., other zones that have not reached the target.

With the individualized target control for each zone or group of zones, a CMP stop layer is no longer needed, which saves dimension allowance for other features of a device. The WiW uniformity is improved as the CMP target is individually controlled for zones having different structure features. The overall CMP operation is simplified and the CMP consumables are reduced.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 illustrates an example chemical mechanical polishing (CMP) operation environment 100. Referring to FIG. 1, the CMP operation environment 100 includes a CMP platform 110 and a controller 150. The CMP platform 110 includes one or more loadlocks 112, a dry metrology 114, a cleaner 116, a high-rate platen 118, a low-rate platen 120, a buffing platen 122, and/or one or more sensors (not specifically shown for generality) attached to various locations on or adjacent to the CMP platform 110. The loadlocks 112 are used for loading a wafer into the CMP platform 110, and unloading the wafer. The dry metrology 114 is used to measure the thickness of a feature(s) or a surface area (zone) to be polished under a target control, e.g., a target zone. The cleaner 116 is used to clean the wafer after the CMP processes. The high-rate platen 118 is used for polishing the wafer with a relatively high polishing rate, e.g., higher than the polishing rate of the low-rate platen 120 The low-rate platen 120 is used for polishing the wafer with a relatively low polishing rate, e.g., lower than the polishing rate of the high-rate platen 118. The buffing platen 122 is used for lightly polishing the wafer in order to fix defects and/or scratches on the wafer surface.

The controller 150 is communicatively coupled to the CMP platform 110 and is configured to control a CMP operation performed with the CMP platform 110. For example, the controller 150 controls the loading and unloading of a wafer, the setting of the platens 118, 120, 122, the identifying of the zones on a wafer, and the zone-based and/or unzoned target control of a zone of a wafer during a CMP process/operation.

In the description herein, a CMP operation refers to polishing a wafer surface with a CMP target(s) reached for the whole wafer surface. A CMP operation may include more than one CMP process which polishes the wafer to reach the CMP target for a zone or a group of zones within the wafer.

Figure 2:
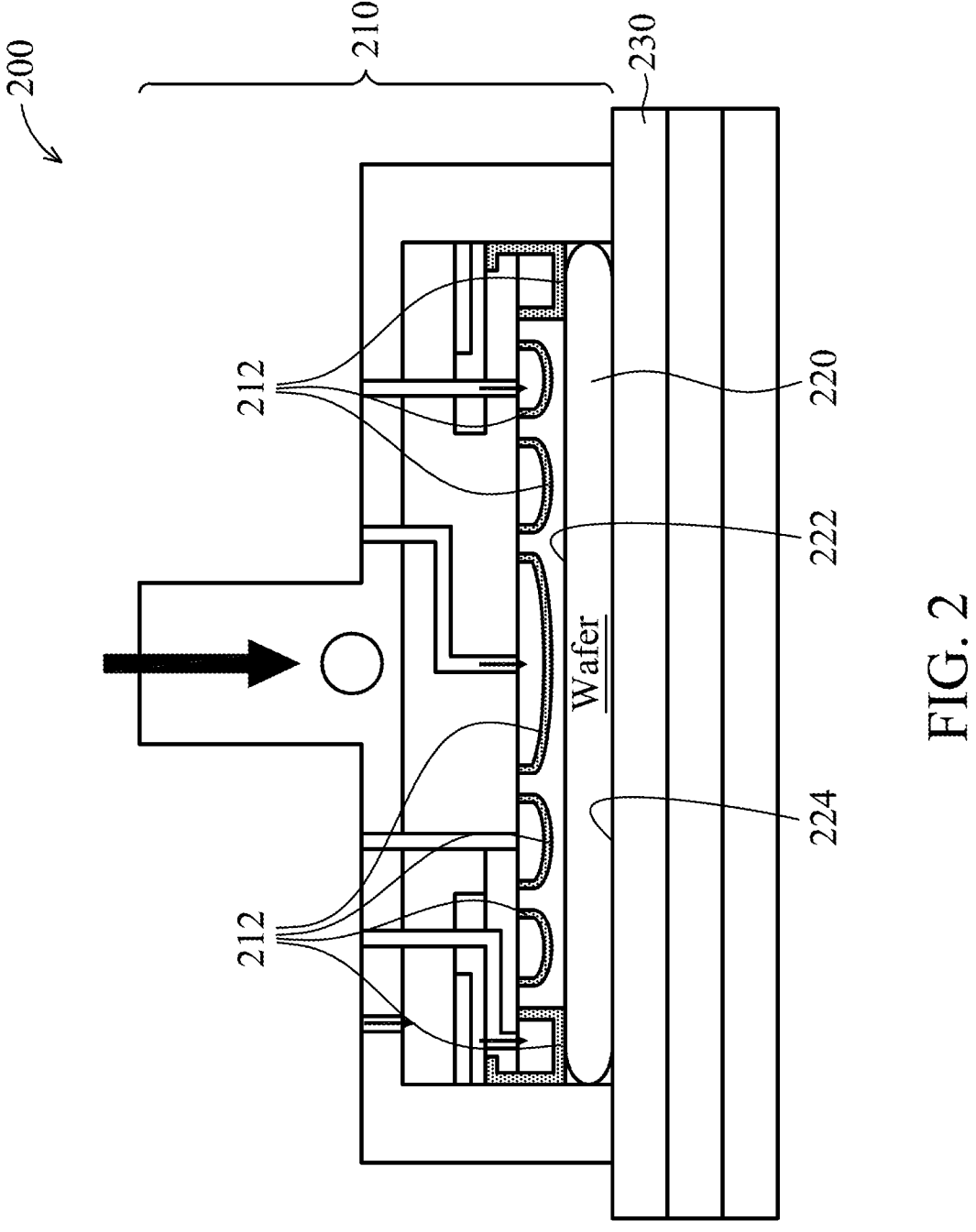
FIG. 2 illustrates an example platen according to embodiments of the disclosure.

FIG. 2 shows an illustrative an example platen 200, which may be used for one or more of the high-rate platen 118, the low-rate platen 120, or the buffing platen 122. Referring to FIG. 2, the platen 200 includes a wafer carrier 210 that holds a wafer 220 with pushing pressures applied to a backside (or lower surface) 222 of the wafer 220. With the pushing pressure, an upper surface 224 of the wafer 220 is forced against a polish pad 230. The upper surface 224 of the wafer 220 refers to a wafer surface where layers of semiconductor structures are built up from the substrate. The wafer 220 may be positioned up-side-down, like illustratively shown in FIG. 2, which does not affect the definition of the upper surface 224. The wafer carrier 210 includes multiple different membranes 212, which are configured to be individually controlled to provide the same or different pushing pressures to the respective concentric portions of the wafer 220. By controlling the pushing pressures of each membrane 212, the different concentric portions of the wafer 220 may have different polish rates, with greater pushing pressure resulting in a higher polish rate and lower pushing pressure resulting in a lower polish rate. In a case that the membranes 212 are adjusted or customized for a specific wafer 220 with multiple zones arranged in a concentric pattern, the pushing pressures of the membranes 212 may be controlled or adjusted to effectuate different polish rates for different zones on the wafer 220.

Figure 3:
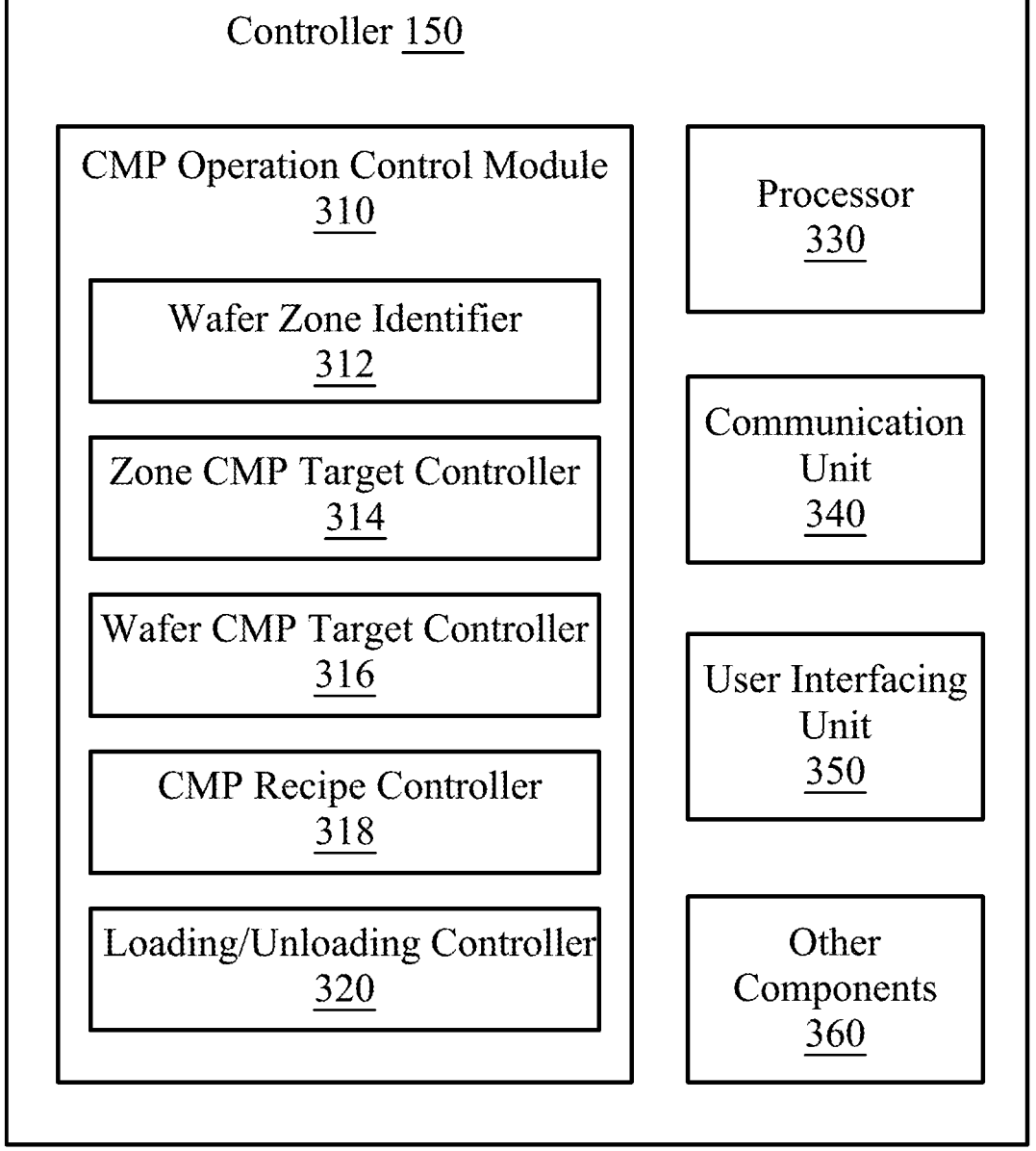
FIG. 3 illustrates an example controller according to embodiments of the disclosure.

FIG. 3 shows details of an example controller 150. Referring to FIG. 3, the controller 150 includes a CMP operation control module 310, a processor 330, a communication unit 340, a user interfacing unit 350, and other components 360. The CMP operation control module 310 includes a wafer zone identifier 312, a zone CMP target controller 314, a wafer CMP target controller 316, a CMP process controller 318, and a loading/unloading controller 320.

In an embodiment, the CMP operation control module 310, and each component thereof, may be implemented through executable instructions stored in dedicated spaces in a storage device (not shown for simplicity), embedded firmware, and/or programmable logics, e.g., FPGA, or other suitable implementations. These executable instructions may be executed by the processor 330 (stand-alone, embedded, or cloud-based) in controlling a CMP operation conducted through the CMP platform 110. The control output/instructions may be communicated through the communication unit 310 and/or through the user interfacing unit 350. User inputs may be obtained through the user interfacing unit 350 in the operation of the CMP operation control module 310. The operations of the CMP operation control module 310 are described herein together with an example CMP flow 400 shown in FIG. 4.

FIGS. 5A-5E show an example wafer 500 in various stages of an example CMP operation to achieve a CMP target thickness, referred to as "a CMP target," on the wafer 500. The example wafer 500 and the example CMP method 400 are provided for illustrative purposes, which do not limit the scope of the disclosure.

Figure 4:
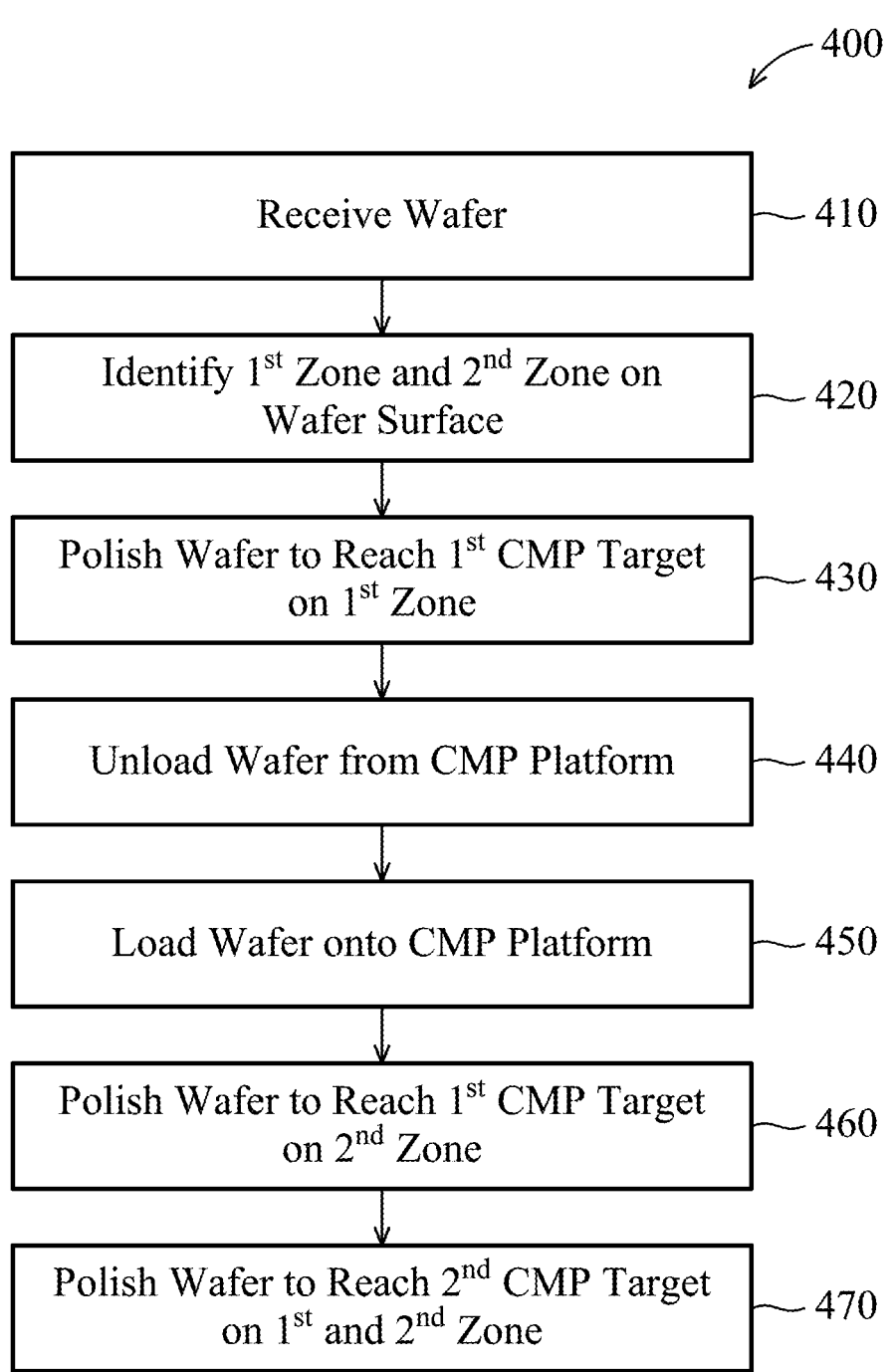
FIG. 4 illustrates an example process according to embodiments of the disclosure.
Figure 5A:
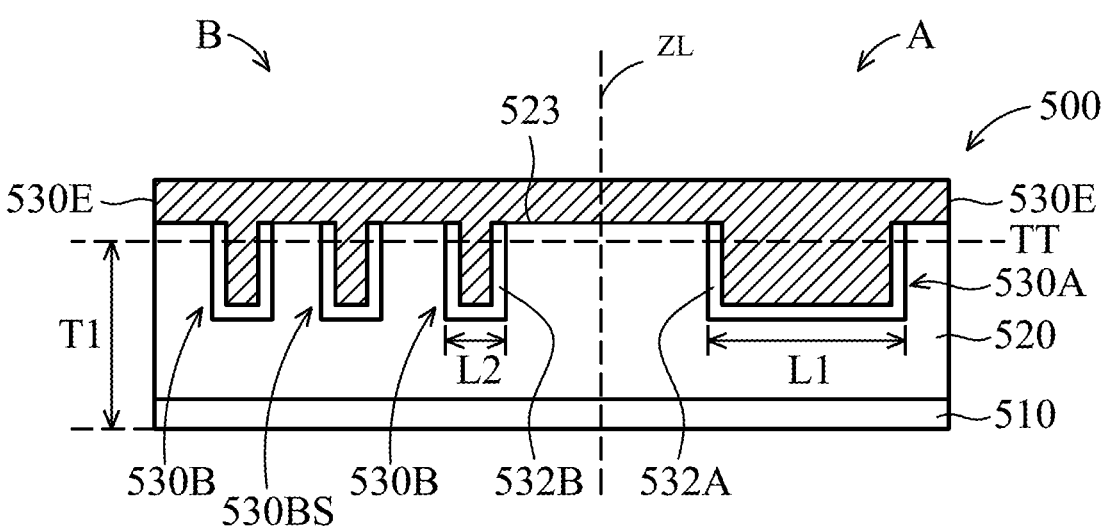
FIGS. 5A-5E illustrate an example wafer in various stages of a CMP operation according to embodiments of the disclosure.

Referring to FIG. 4, with reference also to FIG. 5A, in example process 410, a wafer 500 is received. The wafer 500 includes a substrate 510, a semiconductor body (not shown for simplicity), an inter-layer dielectric (ILD) 520, and multiple replacement metal gate structures 530A, 530B.

The gate structure 530A is a long channel gate structure and the gate structures 530B are short channel gate structures. The long channel gate structure 530A has a longer gate length L1 than the gate length L2 of the short channel gate structures 530B. As shown in FIG. 5A, generally the long channel gate structures 530A include more spacing between/among one another (only one long channel gate structure 530A is shown for simplicity) as compared to the short channel gate structures 530B. As such, surface area A and surface area B are different in the metal versus dielectric ratios, e.g., the surface area containing metal materials versus the surface area containing dielectric materials. Further, the number of metal features in a unit surface area, e.g., referred to as density of metal structures, may also be considered to be different between surface area A and surface area B. For example, as shown in FIG. 5A, more specifically, surface area B which includes the short channel gate structures 530B, at the current stage of the wafer 500, has a higher density of metal structures than surface area A that includes the long channel gate structure 530A.

The wafer 500 includes an excessive metal layer 530E formed in the formation of the long channel gate structures 530A and the short channel gate structures 530B, 530BS. In some embodiments, optionally, a liner layer 532A, 532B of conductive material or dielectric material may be formed between the long channel gate structures 530A or the short channel gate structures 530B, 530BS and the ILD 520, respectively. The liner layer 532A, 532B may also be configured to be gate dielectric layer.

The following description lists examples of materials for metal gate structures 530A, 530B; however, it is understood that other suitable materials not listed are within the contemplated scope of the present description. Each metal gate 530A, 530B, 530BS includes a metal or a metal compound material. Suitable metal materials include ruthenium, palladium, platinum, tungsten, cobalt, nickel, and/or conductive metal oxides and other suitable P-type metal materials, and may include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials. In some examples, the gate structures 530A, 530B, 530BS include a work function layer tuned to have a proper work function for enhanced performance of the field effect transistor devices. For example, suitable N-type work function metals include Ta, TiAl, TiAlN, TaCN, other N-type work function metals, or a combination thereof; and suitable P-type work function metal materials include TiN, TaN, other p-type work function metals, or a combination thereof. In some examples, a conductive layer, such as an aluminum layer, is formed over the work function layer such that the gate structures 530A, 530B include a work function layer disposed over the gate dielectric and a conductive layer disposed over the work function layer.

Materials for ILD 520 includes silicon oxide ($SiO_2$), silicon oxynitride, silicon nitride ($Si_3N_4$), silicon monoxide (SiO), silicon oxynitrocarbide (SiONC), silicon oxycarbide (SiOC), silicon mononitride (SiN), and other low-K dielectrics or other suitable materials.

For illustrative purposes, a CMP operation thickness target T1 is set, i.e., a thickness of the wafer 500 after the CMP operation. The CMP target T1 is set with WiW uniformity throughout the whole surface of the wafer 500, as illustratively shown with dotted line TT. The CMP target thickness T1 may be any target thickness that involves WiW and/or WtW uniformity. The target thickness T1 may be an initial target for only the high-rate polish or may be a final target for the surface TT of the wafer 500 before further fabrication processes are conducted thereupon. In an example, surface area A and surface area B are concentric ring-shaped surface areas.

Because of the differences in the structures features between surface area A and surface area B, the polish rate of surface area A and surface area B will be different under a same CMP process. Under conventional target control approaches, it is complicated and difficult to maintain the WiW uniformity between surface area A and surface area B regarding the CMP target T1.

In example process 420, the wafer zone identifier 312 identifies multiple surface zones (zone) on the surface of the wafer 500 for the purposes of individualized zone-based CMP target control for each identified zone or each group of identified zones. The identification of the multiple zones may be based on any tests indicating an individualized target control of multiple portions of surface areas is preferred. For example, the zones may be determined based on the structure feature differences, the material composition differences, the feature density differences, etc., or any other differences between two zones or groups of zones that result in a CMP process affecting one zone differently than the another zone. The zones may also be identified based on whether or not further fabrication processes are to be performed on a specific area before the CMP target T1 is reached. In an embodiment, the zones are already determined in the fabrication process design and such zoning information is communicated to or retrieved by the wafer zone identifier 312.

As an illustrative example, wafer surface areas A and B are identified as two different zones A and B, illustratively shown with a borderline ZL, for individualized zone-based target control.

For illustrative purposes, a gate line opening process will be performed on zone B to remove one or more short channel gate structures 530BS to further isolate, i.e., increase the spacing, between some short channel gate structures 530B before the CMP target thickness T1 is reached for zone B. For zone A, no further fabrication process is to be performed before the target thickness T1 is reached.

Figure 5B:
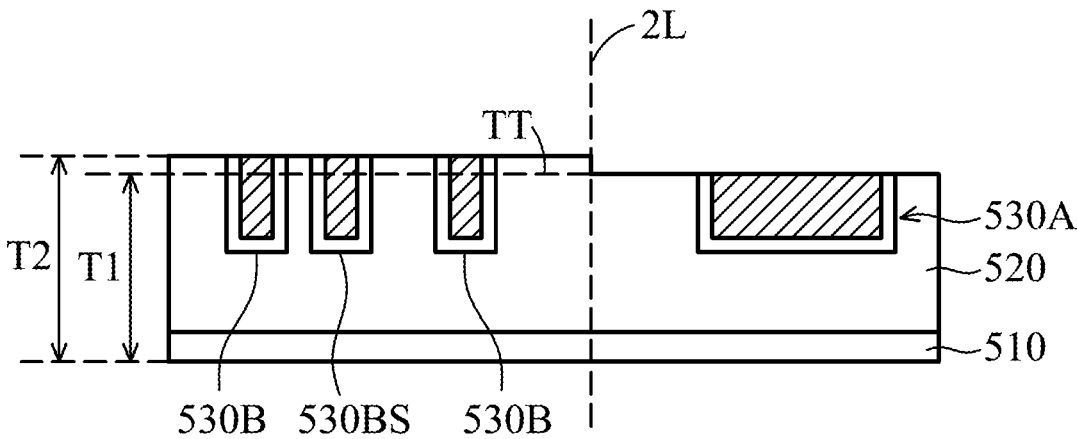

In example operation 430, with reference also to FIG. 5B, the zone CMP target controller 314 controls the CMP platform 110 to polish the wafer 500 with a first CMP process to achieve the CMP target T1 for a first zone, e.g., zone A, only. The first CMP process is selective to other zones, here zone B. As a result of the selective first CMP process, when zone A reaches the CMP target thickness T1, a thickness T2 of zone B is larger than the thickness of zone A. The selective first CMP process may include physical components and/or chemical components. For the physical components, the temperature, surface pressure, rotation speed, the polish pad 230 profile, and the pushing pressures of the membranes 212 are selected to have a higher polish rate for the zone A surface as compared to the zone B surface. For the chemical components, the first CMP slurry is selected to polish the zone A surface with a higher rate as compared to the zone B surface. For example, a recipe with a higher temperature, lower rotation speed, lower surface pressure, and an oxidizer containing slurry is works better to remove a metal surface or a surface with a higher ratio of metal materials over dielectric materials. On the other hand, a recipe with a lower temperature, higher rotation speed, higher surface pressure and a slurry containing no oxidizer works better to polish a dielectric surface or a surface with higher ratio of dielectric material over metal materials. The pushing pressure of the membranes 212 may be adjusted such that zone A is pressed closer against the polish pad 230 than zone B.

Further, the CMP processes may be used to have selectivity among different metal materials and/or different dielectric materials, and/or different combinations of metal and dielectric materials. For example, for polishing a zone of metal rich long channel structures, the pushing pressures of membrane 212 is between 0.5-1.5 psi and the platen/head rotation speed is between 30-60 rpm with an oxidizer containing slurry. For a zone of dielectric rich short channel structures, the pushing pressures of membrane 212 is between 1.5-3 psi and the platen/head rotation speed is between 90-120 rpm with a slurry containing metal inhibitors.

FIG. 5B shows, for illustrative purposes only, that after the first CMP process, a sharp transition, e.g., step-shaped transition, is generated between the surface of the zone A and the surface of the zone B. However, such step-shaped transition is not necessarily desirable or feasible and a sloped transition between the surface of the zone A and the surface of the zone B is also acceptable.

The zone-based target control may also include other target control techniques like monitoring the wafer thickness using the sensors attached to or associated with the platform 110. Further, the wafer thickness of the relevant zone, here zone A, may be measure multiple times by the dry metrology 114 (FIG. 1) in the course of the target control of zone A. The CMP process to achieve the target thickness T1 of zone A may include multiple sub-processes or multiple stages of CMP processes. For example, at a first stage, a CMP process may be chosen to efficiently polish the excess metal material 530E until closer to a metal/dielectric interface 523. Then at a second stage, another CMP process selective to the zone B surface is used to polish the wafer 500 surface until the target thickness T1 is reached on zone A. As the second stage CMP process is selective to zone B, when the target thickness T/is reached on zone A, the thickness T2 of zone B is larger than the target thickness T1.

The zone CMP target controller 314 may function together with the CMP process controller 318 in selecting the suitably selective CMP processes in achieving the target control of a specific zone, here zone A, of the wafer 500. The selective CMP processes may be determined by the CMP process controller 318 automatically, may be stored in a database and retrieved by the CMP process controller 318 based on the structure features of the relevant zone, or may be obtained by the CMP process controller 318 through user inputs, or other suitable approaches.

It should be appreciated that CMP process controller 318 may control or determine all the parameters and/or condition of a CMP process and all components of a CMP machine effecting the CMP process. For example, other than the chemical and mechanical components of the recipe listed herein, the CMP process controller 318 may also determine and set a pad conditioning parameter for a specific zone. The CMP process controller 318 may change the diamond crystal size, diamond crystal morphology and crystal surface density of a diamond disk of a pad surface dresser for conditioning the polish pad for different zones.

In example process 440, the loading/unloading controller 320 controls the CMP platform 110 including the loadlocks 112 to unload the wafer 500 from the CMP platform 110 for fabrication processes other than CMP to be performed on zone B.

Figure 5C:
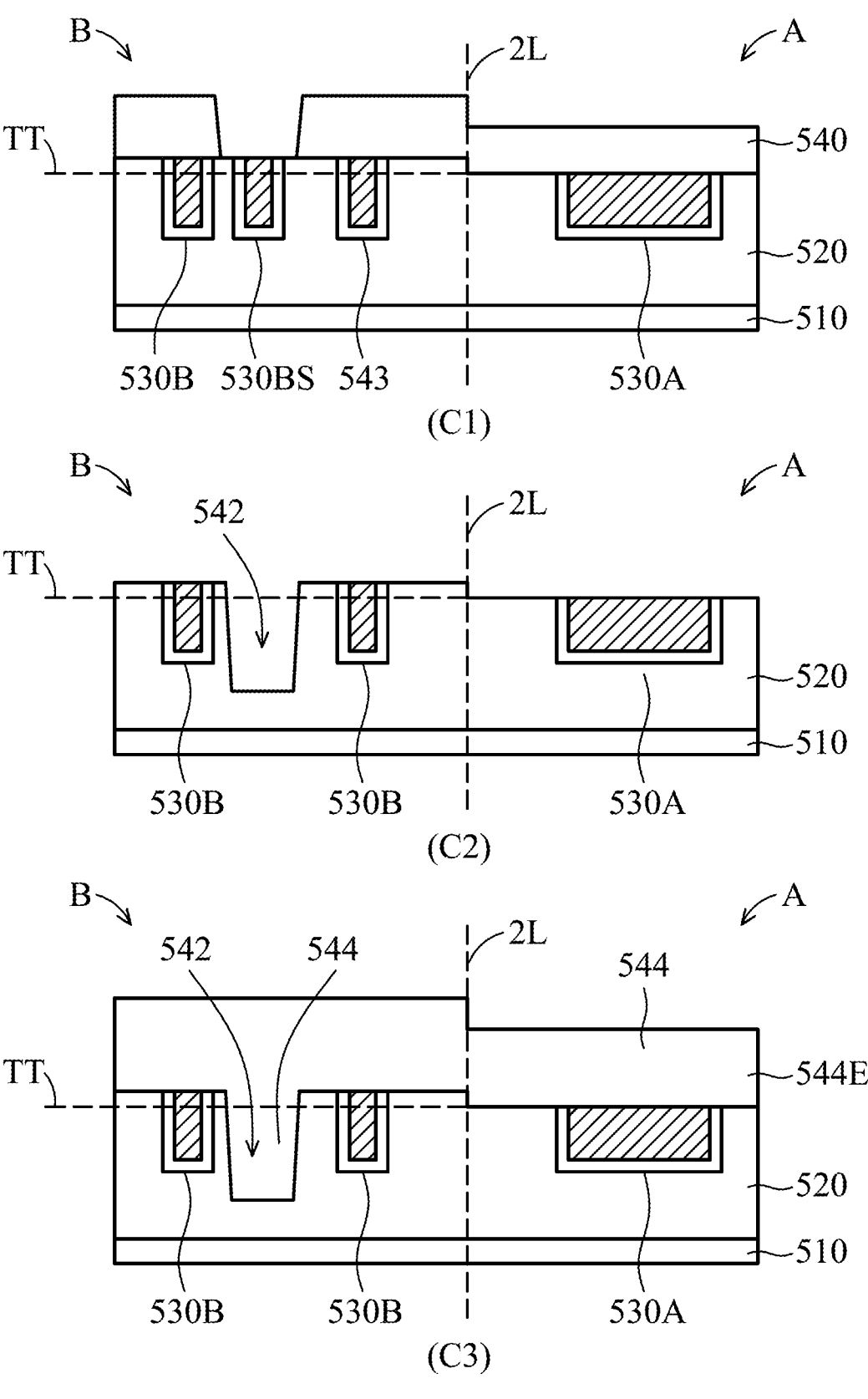

Referring to FIG. 5C, an illustrative example gate line isolation process is shown as performed on zone B of the wafer 500. In step C1, a photoresist layer 540 is formed over the surface of the wafer 500 and patterned to expose the short channel gate structure 530BS that is to be removed for gate line isolation.

In step C2, the exposed short channel gate structure 530BS is removed, e.g., by etching, and a recess 542 is formed through removing the short channel gate structure 530BS.

In step C3 a dielectric layer 544 is formed filling the recess 542. The dielectric layer 544 is silicon oxide or a low-K dielectric material. The dielectric layer 544 may include a same or different dielectric material from that of the ILD 520. The dielectric layer 544 includes an excess portion 544E over the surface of zone A and the surface of zone B.

Referring back to FIG. 4, in example process 450, the loading/unloading controller 320 controls the CMP platform 110 to load the wafer 500 back to a suitable one of the high-rate platen 118 or the low-rate platen 120. The choice between the high-rate platen 118 or the low-rate platen 120 may be determined based on the CMP process controller 318 in determining a CMP process for polishing the excess dielectric layer 544E and the zone B surface.

Figure 5D:
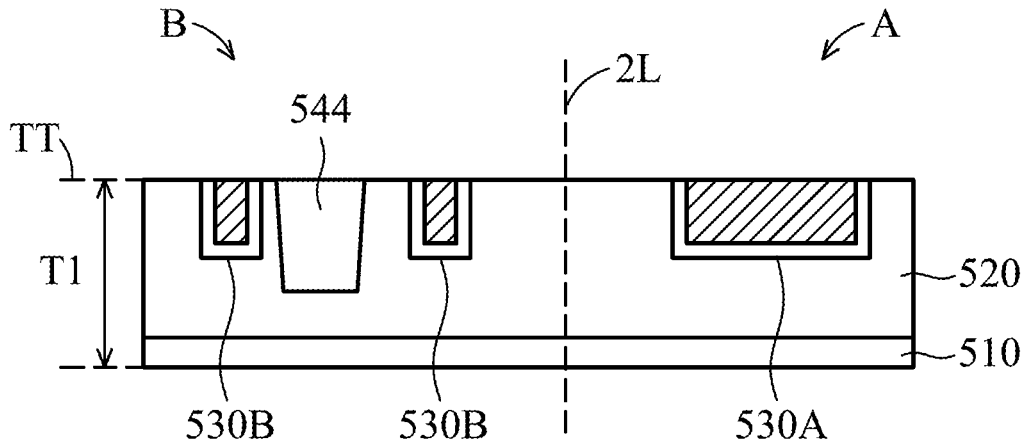

In example process 460, with reference also to FIG. 5D, the zone CMP target controller 314 controls the CMP platform 110 to achieve the CMP target T1 for the second zone, here zone B, with a CMP process selective to other zones, here zone A. As a result of the selective CMP process, when zone B reaches the CMP target thickness T1, a thickness of zone A is substantially unaffected or unaffected and remains as T1 or substantially as T1. As such, with two separate zone-based CMP target controls, the CMP target thickness T1 is achieved for the whole wafer 500, and WiW uniformity is achieved between zone A of the long channel gate structure 530A and zone B of the short channel gate structures 530B.

Figure 5E:
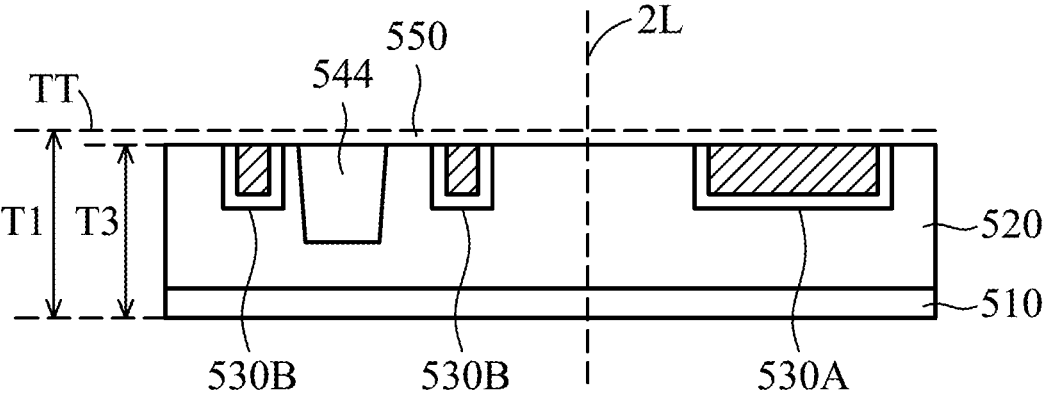

Optionally, in example process 470, with reference also to FIG. 5E, the wafer CMP target controller 316 controls the CMP platform 110 to polish the wafer 500 surface until a CMP target thickness T3 is reached for all zones A, B of the wafer 500. In an embodiment, the target T3 is equal to the target T1 and the process 470 is a buffing process to improve wafer surface quality. In another embodiment, the target T3 is different from the target T1 and a small portion 550 (illustrated with dotted lines) of the wafer 500 surface is polished off to achieve WtW uniformity. In the example process 470, a CMP process with low selectivity among the multiple zones A, B is used such that the target T3 is achieved in an unzoned way with WiW uniformity among the multiple zones, zone A and zone B. In the example process 470, the removal amount is controlled to be very small such that a low selectivity CMP process and a low-rate polish or buffing is sufficient and effective.

In the description of the example embodiment, a metal versus dielectric ratio is sued as an illustrative example of classifying zones on a wafer surface, which is not limiting. The wafer surface may be classified into multiple zones based on any criteria, which are all included in the disclosure of zone based target control in CMP. For example, different dielectric materials may have different hardness values and may need to be classified into different zones. For example, silicon carbide includes higher hardness than silicon oxide. Further, some etch stop layer or CMP stop layer, like silicon nitride, may be treated similarly as a metal material as against a dielectric material in determining the zones on a wafer surface.

With the zone-based CMP control techniques of the disclosure, the WiW uniformity and/or the WtW uniformity can be more easily achieved because there is no need for complex target control measures to accommodate the different structure features and the different polish rates among areas of the wafer surface in a CMP process that does not utilize target control based on different zones of the wafer. For example, CMP stop layers are not needed, which saves space for more critical functional features. In accordance with the disclosed embodiments, target control for each zone is more accurate because of the uniformity of the structure features within each zone. Also, the zone-based CMP control can easily accommodate additional fabrication processes performed on one or more of the zones, between the CMP operations, by separating the CMP target control of individual zones into separate CMP processes. As such, the volume of consumables used is reduced and the whole process is simplified.

The present disclosure may be further appreciated with the description of the following embodiments:

In a method embodiment, a wafer is received. A first zone and a second zone are identified on a surface of the wafer. The first zone has a structure feature different from the second zone. The wafer is polished using a first CMP process to achieve a first CMP target thickness on the first zone. After that, the wafer is polished using a second CMP process to achieve the first CMP target thickness on the second zone.

In another method, a wafer is received. A first feature and a second feature are identified on the surface of the wafer. The first feature is different from the second feature. The wafer is polished using a first CMP process until the first feature reaches a first CMP target thickness. Then, the wafer is polished using a second CMP process until the second feature reaches the first CMP target thickness.

In another embodiment, a system includes a CMP platform and a controller operable to control the CMP platform in polishing a wafer until a first target thickness is reached. The control actions include identifying a first zone and a second zone on a surface of the wafer, the first zone having a structure feature different from a structure feature of the second zone; controlling the CMP platform in polishing the wafer with a first CMP process until the first target thickness is reached on the first zone, the first CMP process being selective to the structure feature of the second zone; and controlling the CMP platform in polishing the wafer with a second CMP process until the first target thickness is reached on the second zone, the second CMP process being selective to the structure feature of the first zone.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of performing chemical mechanical polishing (CMP) on a wafer, comprising:

identifying a first zone and a second zone on a surface of the wafer;

achieving a first CMP target thickness on the first zone by polishing the wafer using a first CMP process;

removing a first structure feature having a first material from the second zone to generate a recess;

filing the recess with a second material that is different from the first material; and after the filing the recess, achieving the first CMP target thickness on the second zone by polishing the wafer using a second CMP process.

2. The method of claim 1, wherein the first CMP process has a higher removal rate for a structure feature in the first zone than for a structure feature in the second zone.

3. The method of claim 1, wherein the second CMP process has a higher removal rate for a structure feature in the second zone than for a structure feature in the first zone.

4. The method of claim 1, further comprising achieving a second CMP target thickness on the first zone and the second zone together by polishing the wafer using a third CMP process.

5. The method of claim 4, wherein the polishing the wafer using the third CMP process including polishing the wafer using the third CMP process that has a lower polishing rate than the first CMP process and the second CMP process.

6. The method of claim 4, wherein the third CMP process is a buffing process.

7. The method of claim 1, wherein the polishing the wafer using the first CMP process includes applying a higher pushing pressure toward a wafer backside of the first zone than toward a wafer backside of the second zone.

8. The method of claim 1, wherein the first zone and the second zone are substantially concentric among one another.

9. The method of claim 1, wherein the polishing the wafer using the second CMP process includes applying a higher pushing pressure toward a wafer backside of the second zone than toward a wafer backside of the first zone.

10. The method of claim 1, wherein the first zone includes a long channel metal gate structure and the second zone includes a short channel metal gate structure.

11. The method of claim 10, wherein the first structure feature is the short channel metal gate structure.

12. The method of claim 1, wherein the first zone and the second zone are different in a metal versus dielectric ratio.

13. The method of claim 1, wherein the first zone and the second zone are different in a density of structure features.

14. A method of performing chemical mechanical polishing (CMP) on a wafer, comprising:

identifying a first feature and a second feature on a surface of the wafer, the first feature being different from the second feature;

polishing the wafer using a first CMP process until a first feature reaches a first CMP target thickness;

removing the second feature to form a recess;

forming a third layer within the recess; and polishing the wafer using a second CMP process until the third feature reaches the first CMP target thickness.

15. The method of claim 14, wherein the first CMP process has a higher removal rate for the first feature than for the second feature.

16. The method of claim 14, wherein the second CMP process has a higher removal rate for the third layer than for the first feature.

17. The method of claim 14, further comprising, after the second CMP process, polishing the wafer using a buffing process.

18. The method of claim 14, wherein the polishing the wafer using the first CMP process includes applying a higher pushing pressure toward a wafer backside of the first feature than toward a wafer backside of the second feature.

19. A method for performing chemical mechanical polishing (CMP) on a wafer; comprising:

identifying a first zone and a second zone on a surface of the wafer;

polishing the wafer with a first CMP process until a first target thickness is reached on the first zone;

after the first target thickness is reached on the first zone, forming a structure in the second zone; and after the forming the structure in the second zone, polishing the wafer with a second CMP process until the first target thickness is reached on the second zone.

20. The method of claim 19, wherein the forming the structure in the second zone includes forming the structure filling a recess in the second zone.

\* \* \* \* \*